US009128502B2

(12) United States Patent
Imbornone et al.

(10) Patent No.: US 9,128,502 B2
(45) Date of Patent: Sep. 8, 2015

(54) ANALOG SWITCH FOR RF FRONT END

(71) Applicant: QUALCOMM Incorporated, San Diego, CA (US)

(72) Inventors: James Francis Imbornone, Boxborough, MA (US); Xinwei Wang, Dunstable, MA (US); Zhenying Luo, Boxborough, MA (US); Xiangdong Zhang, Westford, MA (US)

(73) Assignee: Qualcomm Incorporated, San Diego, CA (US)

( * ) Notice: Subject to any disclaimer, the term of this patent is extended or adjusted under 35 U.S.C. 154(b) by 9 days.

(21) Appl. No.: 13/961,852

(22) Filed: Aug. 7, 2013

(65) Prior Publication Data

US 2015/0042399 A1    Feb. 12, 2015

(51) Int. Cl.
*H03K 17/687* (2006.01)
*G05F 1/46* (2006.01)
*H03K 17/06* (2006.01)

(52) U.S. Cl.
CPC .............. *G05F 1/461* (2013.01); *H03K 17/063* (2013.01); *H03K 2017/066* (2013.01); *H03K 2217/0018* (2013.01); *H03K 2217/0054* (2013.01)

(58) Field of Classification Search
CPC ................. H03K 2217/0018; H03K 19/0016; H03K 19/00384; G05F 3/205; G11C 5/146
USPC ........................... 327/427, 434, 430, 534, 435
See application file for complete search history.

(56) References Cited

U.S. PATENT DOCUMENTS

| 5,689,209 | A  | * | 11/1997 | Williams et al. ............... 327/425 |
| 5,767,733 | A  |   | 6/1998  | Grugett |
| 6,175,263 | B1 |   | 1/2001  | Lee et al. |
| 6,989,697 | B2 |   | 1/2006  | Dimmler et al. |
| 7,215,189 | B2 |   | 5/2007  | Wilhelm |
| 7,786,756 | B1 |   | 8/2010  | Svilan et al. |
| 7,890,054 | B2 |   | 2/2011  | Umeda et al. |
| 7,955,923 | B1 | * | 6/2011  | Gallerano et al. ............ 438/217 |
| 2006/0001100 | A1 | * | 1/2006 | Kamei et al. ................... 257/355 |
| 2007/0076903 | A1 | * | 4/2007 | Shimomura et al. ......... 381/94.5 |
| 2010/0225377 | A1 |   | 9/2010 | Okashita |
| 2011/0025408 | A1 | * | 2/2011 | Cassia et al. ................... 327/535 |

FOREIGN PATENT DOCUMENTS

| GB | 2484102 A    | 4/2012 |
| WO | 0225393 A1   | 3/2002 |
| WO | 2011080536 A1 | 7/2011 |

OTHER PUBLICATIONS

International Search Report and Written Opinion—PCT/US2014/048025—ISA/EPO—Oct. 21, 2014, 14 pages.

* cited by examiner

*Primary Examiner* — Quan Tra
(74) *Attorney, Agent, or Firm* — Toler Law Group, PC

(57) ABSTRACT

Techniques for improving the linearity of radio-frequency (RF) front-end switches. In an aspect, open-loop techniques are disclosed for superimposing the output voltage of one or more negative rectifiers on a negative substrate bias voltage to reduce the non-linearities associated with voltage-dependent substrate leakage current. In another aspect, closed-loop techniques are further disclosed for maintaining the substrate bias voltage close to a reference voltage. Exemplary embodiments of the circuit blocks are further described.

19 Claims, 13 Drawing Sheets

ANALOG SWITCH FOR RF FRONT END

BACKGROUND

1. Field

The disclosure relates to analog switches for radio-frequency (RF) circuits.

2. Background

State-of-the-art wireless devices are commonly designed to support radio processing for multiple frequency bands and operating modes. For example, a single smart phone may be required to connect to a wide-area network (WAN), a wireless local-area network (WLAN), and/or other radio-frequency (RF) communication links such as Bluetooth, etc. To accommodate this feature, multiple switches (e.g., series and/or shunt switches) are commonly provided to share one or more antennas amongst circuitry for each of the bands and modes.

In certain scenarios, the existence of large-amplitude voltages (e.g., due to high-power voltages generated by a transmit or TX signal path) across such multiple switches may undesirably lead to non-linear distortion, which can interfere with accurate transmission and reception of desired signals by the device. Prior art techniques for improving switch linearity include setting both the gate and substrate bias voltages of switch transistors to be substantially more negative than the expected large-amplitude voltages, when it is desired to turn the corresponding switches off. Ideally, no current should flow through the switches as a result of such negative bias voltages being provided. In practice, however, undesirable leakage current may nevertheless flow, e.g., through the transistor substrates.

It would thus be desirable to provide effective techniques for improving the linearity of multiple switches that do not suffer from the drawbacks of the prior art.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The detailed description set forth below in connection with the appended drawings is intended as a description of exemplary aspects of the invention and is not intended to represent the only exemplary aspects in which the invention can be practiced. The term "exemplary" used throughout this description means "serving as an example, instance, or illustration," and should not necessarily be construed as preferred or advantageous over other exemplary aspects. The detailed description includes specific details for the purpose of providing a thorough understanding of the exemplary aspects of the invention. It will be apparent to those skilled in the art that the exemplary aspects of the invention may be practiced without these specific details. In some instances, well-known structures and devices are shown in block diagram form in order to avoid obscuring the novelty of the exemplary aspects presented herein. In this specification and in the claims, the terms "module" and "block" may be used interchangeably to denote an entity configured to perform the operations described.

Figure 1:
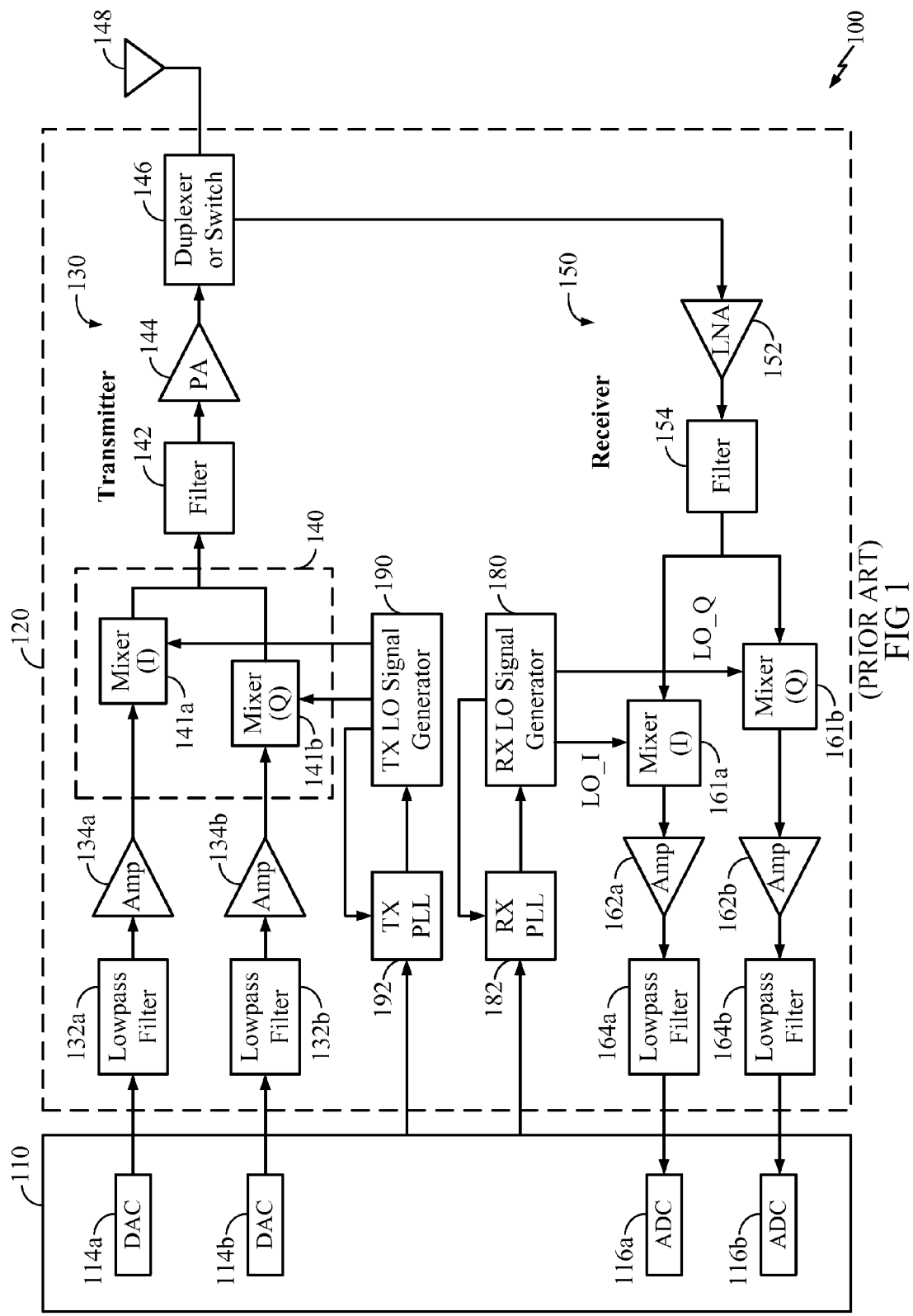
FIG. 1 illustrates a block diagram of a design of a prior art wireless communication device in which the techniques of the present disclosure may be implemented.

FIG. 1 illustrates a block diagram of a design of a prior art wireless communication device 100 in which the techniques of the present disclosure may be implemented. FIG. 1 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 1. Furthermore, other circuit blocks not shown in FIG. 1 may also be used to condition the signals in the transmitter and receiver. Unless otherwise noted, any signal in FIG. 1, or any other figure in the drawings, may be either single-ended or differential. Some circuit blocks in FIG. 1 may also be omitted.

In the design shown in FIG. 1, wireless device 100 includes a transceiver 120 and a data processor 110. The data processor 110 may include a memory (not shown) to store data and program codes. Transceiver 120 includes a transmitter 130 and a receiver 150 that support bi-directional communication. In general, wireless device 100 may include any number of transmitters and/or receivers for any number of communication systems and frequency bands. All or a portion of transceiver 120 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 1, transmitter 130 and receiver 150 are implemented with the direct-conversion architecture.

In the transmit path, data processor 110 processes data to be transmitted and provides I and Q analog output signals to transmitter 130. In the exemplary embodiment shown, the data processor 110 includes digital-to-analog-converters (DAC's) 114*a* and 114*b* for converting digital signals generated by the data processor 110 into the I and Q analog output signals, e.g., I and Q output currents, for further processing.

Within transmitter 130, lowpass filters 132*a* and 132*b* filter the I and Q analog output signals, respectively, to remove undesired images caused by the prior digital-to-analog conversion. Amplifiers (Amp) 134*a* and 134*b* amplify the signals from lowpass filters 132*a* and 132*b*, respectively, and provide I and Q baseband signals. An upconverter 140 upconverts the I and Q baseband signals with I and Q transmit (TX) local oscillator (LO) signals from a TX LO signal generator 190 and provides an upconverted signal. A filter 142 filters the upconverted signal to remove undesired images caused by the frequency upconversion as well as noise in a receive frequency band. A power amplifier (PA) 144 amplifies the signal from filter 142 to obtain the desired output power level and provides a transmit RF signal. The transmit RF signal is routed through a duplexer or switch 146 and transmitted via an antenna 148.

In the receive path, antenna 148 receives signals transmitted by base stations and provides a received RF signal, which is routed through duplexer or switch 146 and provided to a low noise amplifier (LNA) 152. The duplexer 146 is designed to operate with a specific RX-to-TX duplexer frequency separation, such that RX signals are isolated from TX signals. The received RF signal is amplified by LNA 152 and filtered by a filter 154 to obtain a desired RF input signal. Downconversion mixers 161*a* and 161*b* mix the output of filter 154 with I and Q receive (RX) LO signals (i.e., LO_I and LO_Q) from an RX LO signal generator 180 to generate I and Q baseband signals. The I and Q baseband signals are amplified by amplifiers 162*a* and 162*b* and further filtered by lowpass filters 164*a* and 164*b* to obtain I and Q analog input signals, which are provided to data processor 110. In the exemplary embodiment shown, the data processor 110 includes analog-to-digital-converters (ADC's) 116*a* and 116*b* for converting the analog input signals into digital signals to be further processed by the data processor 110.

In FIG. 1, TX LO signal generator 190 generates the I and Q TX LO signals used for frequency upconversion, while RX LO signal generator 180 generates the I and Q RX LO signals used for frequency downconversion. Each LO signal is a periodic signal with a particular fundamental frequency. A PLL 192 receives timing information from data processor 110 and generates a control signal used to adjust the frequency and/or phase of the TX LO signals from LO signal generator 190. Similarly, a PLL 182 receives timing information from data processor 110 and generates a control signal used to adjust the frequency and/or phase of the RX LO signals from LO signal generator 180.

Figure 2:
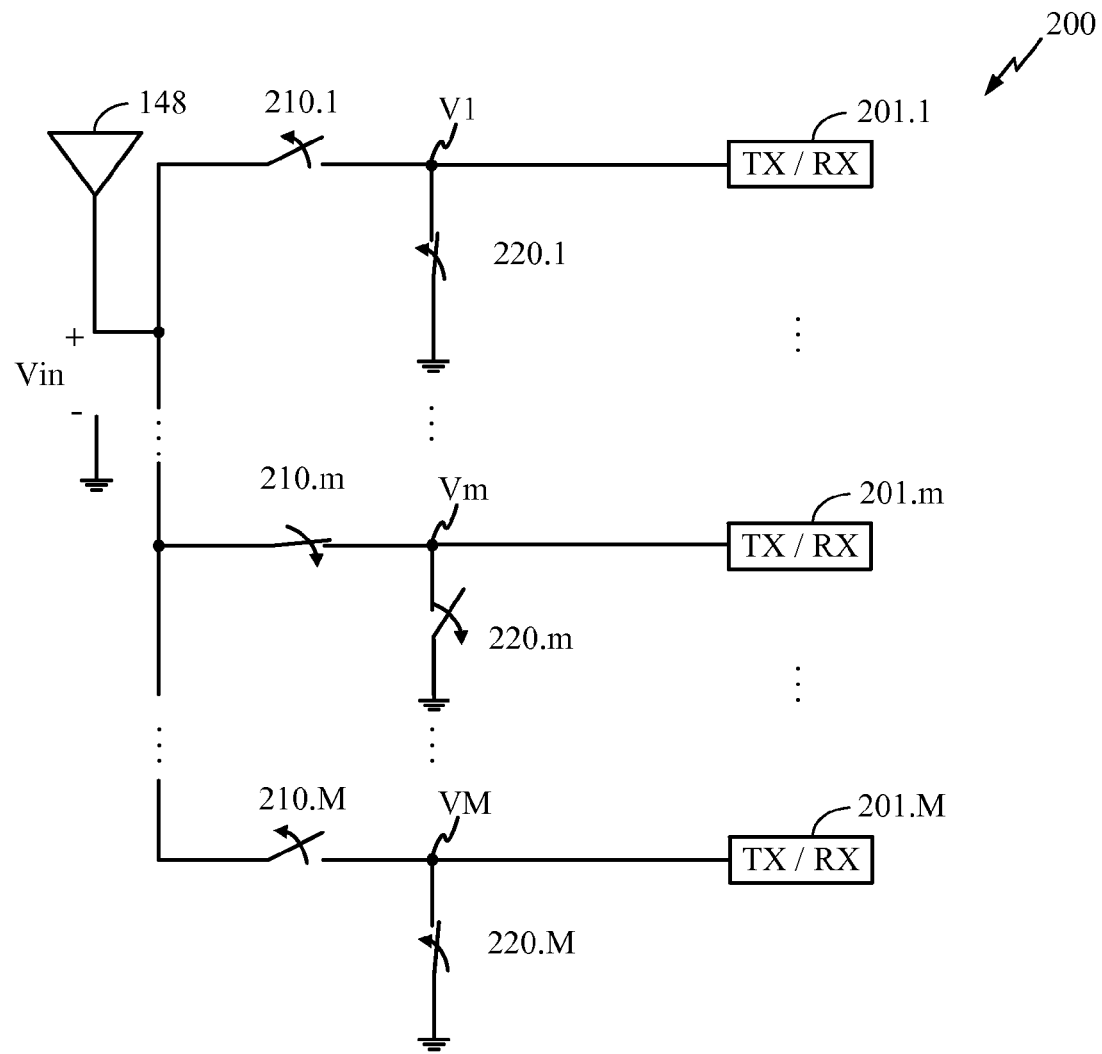
FIG. 2 illustrates a prior art implementation of an RF front end utilizing multiple switches.

State-of-the-art wireless devices are commonly designed to support radio processing for multiple frequency bands and/or operating modes. To support such a feature, multiple switches (e.g., series and/or shunt switches) are commonly provided to share one or more antennas amongst circuitry for each of the bands and modes. FIG. 2 illustrates a prior art implementation of an RF front end 200 utilizing multiple switches. Note FIG. 2 is shown for illustrative purposes only, and is not meant to limit the scope of the present disclosure to any particular applications of the techniques disclosed herein.

In FIG. 2, antenna 148 is coupled to a plurality M of transmit/receive (TX/RX) signal paths 201.1 through 201.M via corresponding RF switches 210.1 through 210.M, respectively. In particular, a voltage Vin is present at the input/output terminal of antenna 148, while voltages V1 through VM are present at the input/output terminal of each of signal paths 201.1 through 201.M, respectively. Each of the signal paths 201.1 through 201.M may be designed to process a distinct frequency band, e.g., signal path 201.1 may process Band 1 signals, signal path 201.*m* may process Band m signals (wherein m is an integer index from 1 to M), etc. To select a unique frequency band Band m for active processing, switch 210.*m* may be closed, while the other switches (e.g., 210.1 through 210.M excluding 210.*m*) may be opened. In this manner, the signal path 201.*m* associated with Band m may be selectively coupled via corresponding switch 210.*m* to the antenna 148, while the other (inactive) signal paths (e.g., circuitry 201.1 through 201.M excluding 201.*m*) may be decoupled from antenna 148.

To provide additional isolation between the active signal path 201.*m* and the other inactive signal paths, shunt switches 220.1 through 220.M excluding 220.*m* are further provided to selectively couple the corresponding voltages V1 through VM excluding Vm to ground. In particular, when signal path 210.*m* is active, switch 220.*m* may be opened, while the other switches (e.g., 220.1 through 220.M excluding 220.*m*) may be closed. In this manner, the voltages associated with the inactive signal paths (e.g., V1 through VM excluding Vm) are grounded when signal path 201.*m* is active.

Figure 3:
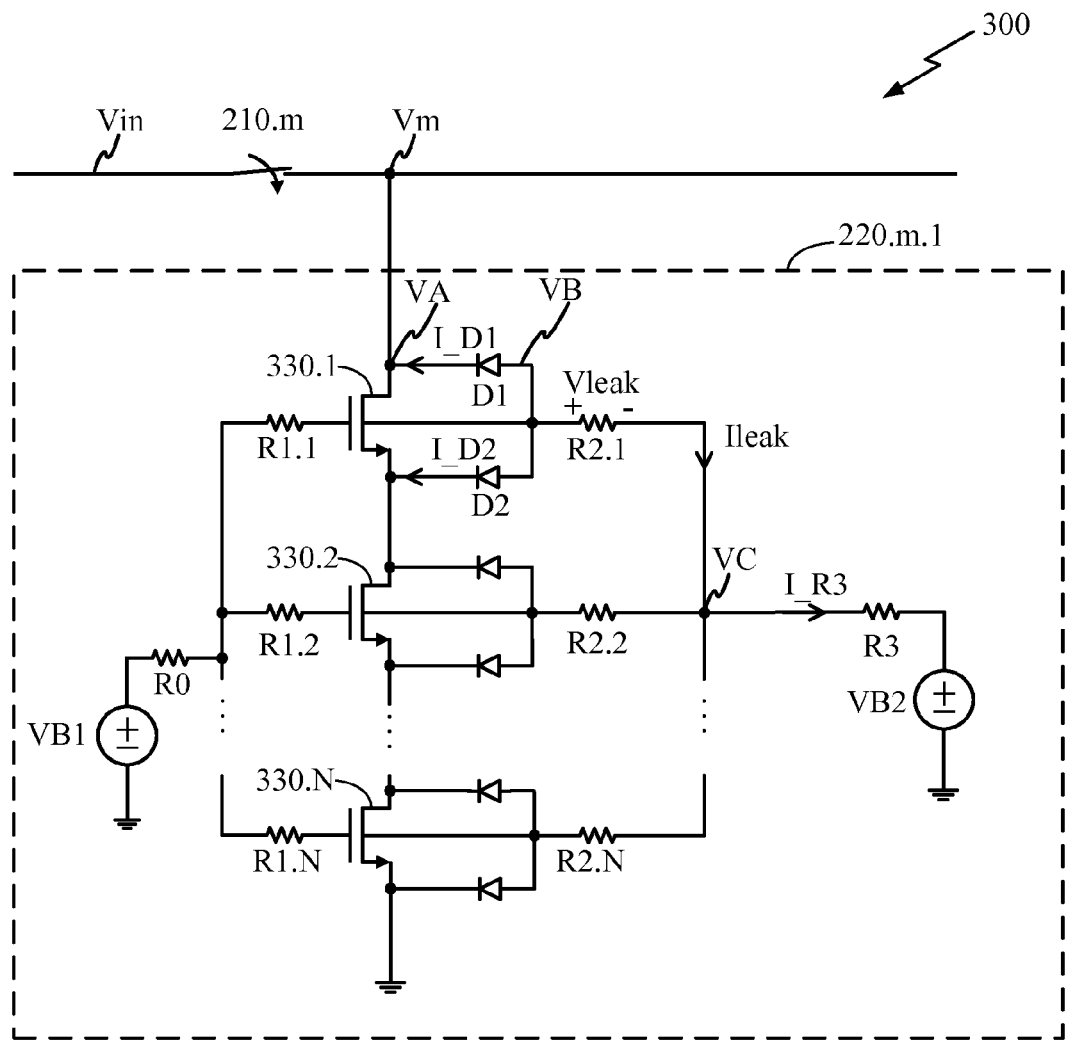
FIG. 3 illustrates a prior art circuit implementation of a shunt switch.

FIG. 3 illustrates a prior art circuit implementation 220.*m*.1 of shunt switch 220.*m*. Note FIG. 3 is shown for illustrative purposes only, and is not meant to limit the scope of the present disclosure to any particular applications of the techniques disclosed herein. Further note that the polarities of the signals shown, e.g., voltage VC and current I_R3, may generally be chosen differently from the examples given in FIG. 3. One of ordinary skill in the art will appreciate that the description hereinbelow will readily apply to circuitry similar to that shown in FIG. 3 but with differing conventions adopted for the signal polarities.

While a particular implementation 220.*m*.1 is shown in FIG. 3 for shunt switch 220.*m*, it will be appreciated that any of switches 220.1 through 220.M may employ the same architecture as that shown for shunt switch 220.*m*.1. Furthermore, while illustrative voltages and waveforms may be provided and described for transistor 330.1 of shunt switch 220.*m*.1, it will be appreciated that similar principles apply to other transistors shown, e.g., transistors 330.2 to 330.N, and to other transistors (not shown) of other switches.

In FIG. 3, series switch 210.*m* is closed, and an illustrative implementation 220.*m*.1 of shunt switch 220.*m* is effectively opened to select signal path 201.*m* for active processing. In particular, shunt switch 220.*m*.1 includes a plurality N of transistors 330.1 through 330.N stacked in series with each other. A first bias voltage VB1 is coupled via resistor R0 to the gates of transistors 330.1 through 330.N via respective resistors R1.1 through R1.N. A second bias voltage VB2 is coupled via resistor R3 (also denoted herein as a "first resistor") to the substrates of transistors 330.1 through 330.N via respective resistors R2.1 through R2.N.

To effectively open shunt switch 220.*m*.1, bias voltages VB1 and VB2 may be set to be substantially more negative than the voltages present at, e.g., the drains and sources of the corresponding transistors. For example, transistors 330.1 through 330.N of the shunt switch 220.*m*.1 may ideally be turned off by setting both gate bias voltage VB1 and substrate bias VB2 to be a substantially negative voltage, e.g., −2.7 V. Accordingly, little or no current should flow through shunt switch 220.*m*.1, e.g., from Vm to ground.

In practice, however, undesirable leakage current may flow through shunt switch 220.*m*.1 even when the negative bias voltages are applied, due to the presence of possibly high power input signals, e.g., large voltage swings at Vm. In particular, a large negative potential established across the drain-to-substrate junction (illustratively shown as a voltage drop VA-VB in FIG. 3) or source-to-substrate junction of any of transistors 330.1 through 330.N (e.g., due to high input power in Vm) may cause associated drain-to-substrate junction diode D1 or source-to-substrate junction diode D2, respectively, to undesirably become less negatively biased. This may cause associated diode currents I_D1, I_D2, etc., to become non-negligible. From these effects, it will be seen that the total leakage current through the substrate of transistor 330.1, also denoted herein as Ileak with reference to FIG. 3, can be attributed to the combination of all currents through the junction diodes existing at the substrate, e.g., I_D1, I_D2, etc.

Accordingly, when Ileak is large, the effective voltage VB applied to the substrate of transistor 330.1 will be rendered correspondingly less negative by an amount Vleak (wherein Vleak equals Ileak·R2.1). This reduces the amount of reverse bias on the substrate. As this effect is present in all transistors 330.2 through 330.N, the linearity of shunt switch 220.*m*.1 may thus be adversely affected by large negative voltage swings in Vm.

Figure 4:
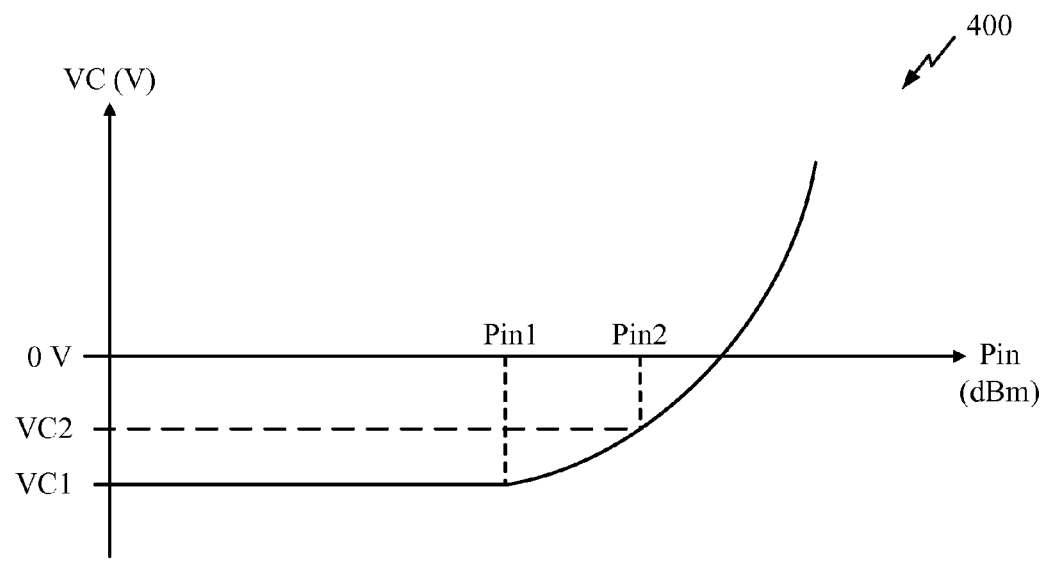
FIGS. 4 and 5 further illustrate the dependence of substrate bias voltage and leakage current on input signal power.
Figure 5:
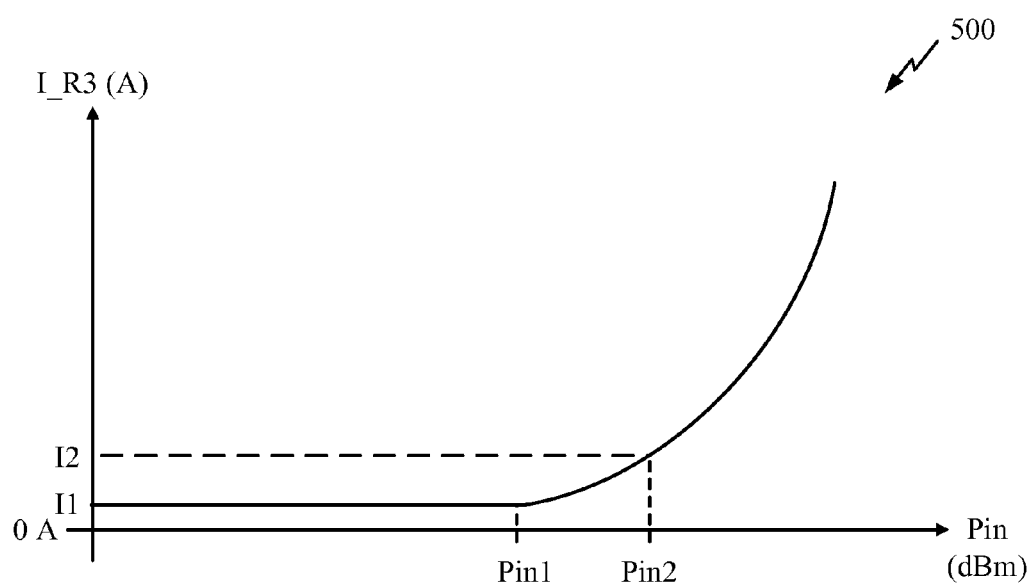

FIGS. 4 and 5 further illustrate the dependence of substrate bias voltage and leakage current on input signal power. Note FIGS. 4 and 5 are shown for illustrative purposes only, and are not meant to limit the scope of the present disclosure to any particular signal waveforms shown.

In FIG. 4, the input power (Pin) of an input signal to a shunt switch (e.g., that corresponding to the voltage Vm in FIG. 3) is plotted on the horizontal axis of the graph, while the bias voltage VC is plotted on the vertical axis. It will be appreciated that at low signal powers, e.g., Pin<Pin1, VC is at a first level VC1. FIG. 5 shows a first level I1 of current I_R3 through resistor R3 corresponding to Pin1 and VC1.

For comparison purposes, VC and I_R3 corresponding to a second input power Pin2 greater than Pin1 are also shown in FIGS. 4 and 5. In particular, a higher signal power Pin2>Pin1 will cause VC to shift from VC1 to a less negative value VC2, i.e., VC2>VC1, and I_R3 to shift from I1 to a larger value I2. Thus higher input power Pin2 generally increases the (amplitude of the) amount of leakage current flowing through the substrates of the transistors, e.g., as quantified by I_R3 in FIG. 3, which also causes the bias voltage VC to become less negative (e.g., due to Ohmic I-R drop across the resistive elements shown).

From the preceding description, it will be appreciated that large-amplitude Vm across shunt switches may undesirably cause amplitude-dependent (or equivalently, input power level-dependent) leakage current, and thereby generate non-linear distortion in the signal voltage. Accordingly, it would be desirable to provide effective techniques for improving the linearity of shunt switches.

Figure 6:
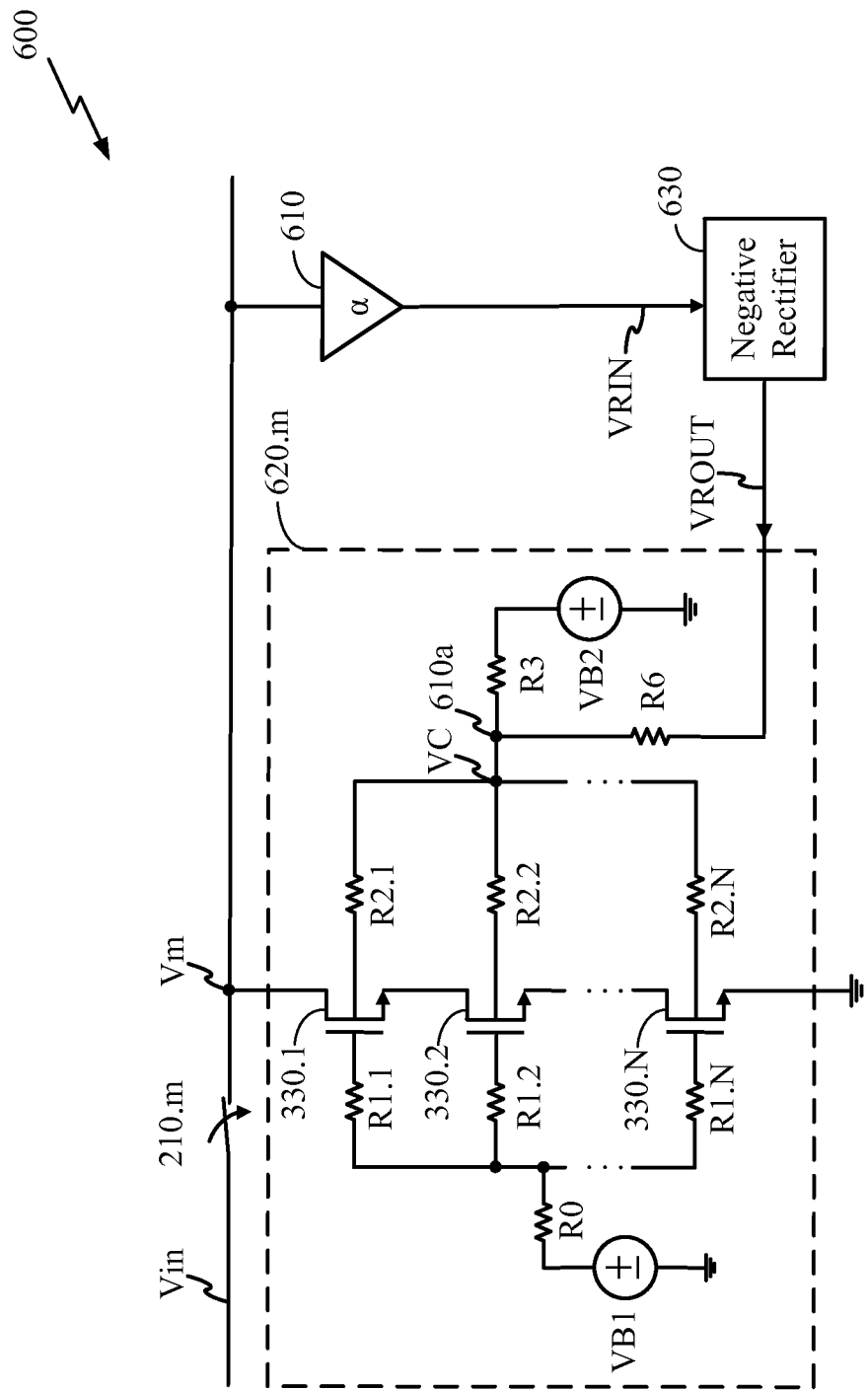
FIG. 6 illustrates an exemplary embodiment of the present disclosure, wherein a negative rectifier is utilized to deal with the aforementioned issues.

FIG. 6 illustrates an exemplary embodiment 600 of the present disclosure, wherein a negative rectifier 630 is utilized to deal with the aforementioned issues. Note FIG. 6 is shown for illustrative purposes only, and is not meant to limit the scope of the present disclosure to any particular exemplary embodiment shown.

In FIG. 6, a gain element 610 having gain a is coupled to voltage Vm at an input to generate an output voltage VRIN (also denoted herein as a "gain voltage") proportional to Vm. VRIN is coupled to a negative rectifier 630, which rectifies a negative portion of VRIN to generate an output voltage VROUT (also denoted herein as a "rectified voltage"). VROUT is coupled to the node 610*a*, supporting the voltage VC, via resistor R6 (also denoted herein as a "second resistor"). In this manner, a voltage component attributable to VROUT will be superimposed on a bias voltage component attributable to VB2 to generate VC. In an exemplary embodiment, VB2 may be generated by, e.g., a charge pump. As VROUT is expected to be negative, VC will be rendered more negative than would be the case if only VB2 were provided to bias the substrates of transistors 330.1 through 330.N. Accordingly, as a more negative bias voltage is applied to the substrate, the linearity of shunt switch 620.*m* may be improved, in light of the description herein above with reference to FIGS. 4-5.

One of ordinary skill in the art will appreciate that various techniques are known in the art for implementing the negative rectification functionality of negative rectifier 630. For example, a negative diode rectifier or a negative voltage doubling rectifier, etc., may be used, as described hereinbelow with reference to, e.g., FIGS. 8 and 11.

In alternative exemplary embodiments (not shown in FIG. 6), e.g., wherein the gain a is set to 1, the gain element 610 may be omitted, and the negative rectifier 630 may instead be directly coupled to voltage Vm. Such alternative exemplary embodiments are contemplated to be within the scope of the present disclosure.

Figure 7:
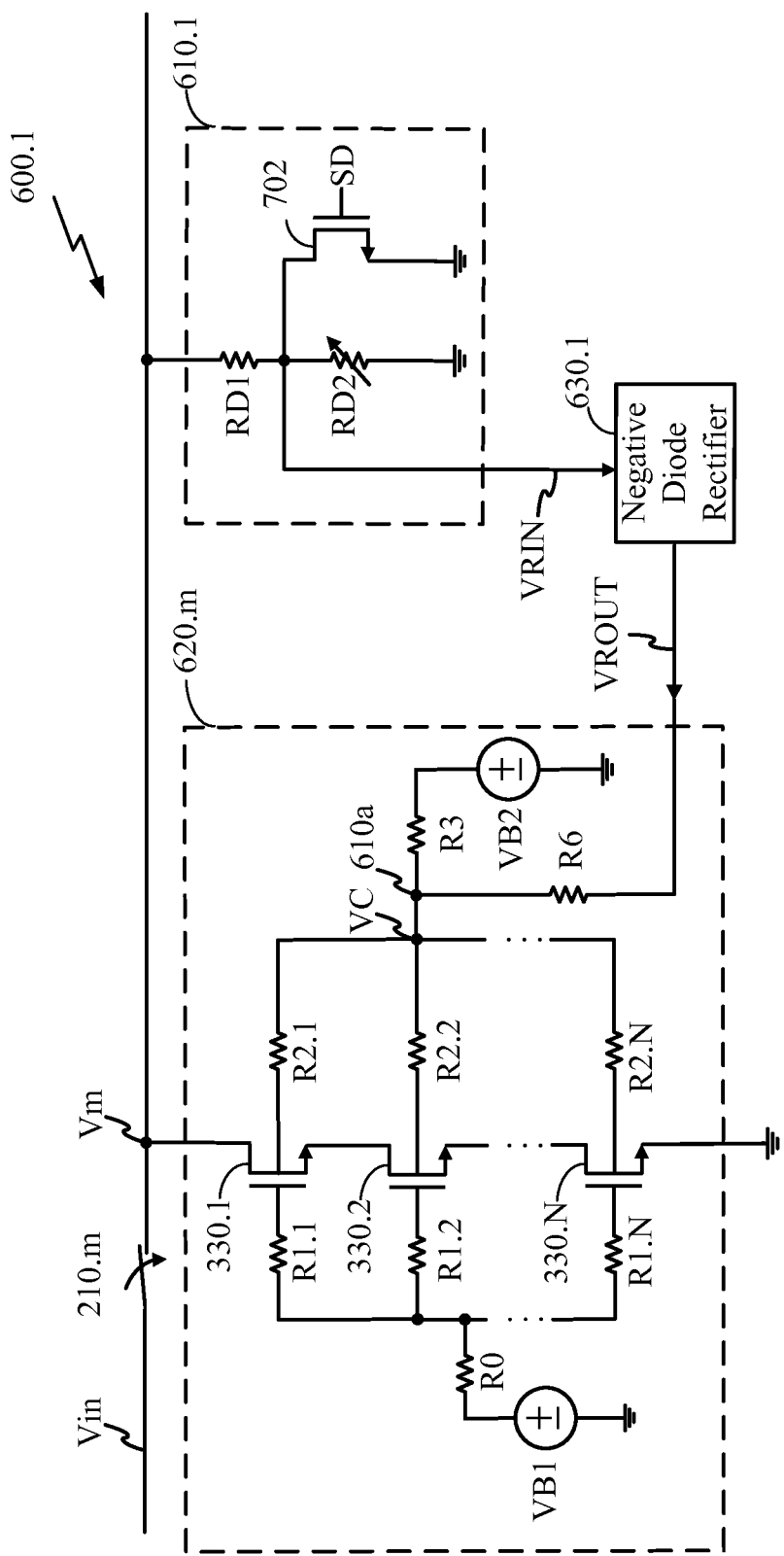
FIG. 7 illustrates an exemplary embodiment of the present disclosure incorporating a specific gain element and a negative diode rectifier.

FIG. 7 illustrates an exemplary embodiment 600.1 of the present disclosure incorporating a specific gain element 610.1 and a negative diode rectifier 630.1. Note FIG. 7 is shown for illustrative purposes only, and is not meant to limit the scope of the present disclosure to any particular exemplary embodiment shown.

In FIG. 7, an exemplary embodiment 610.1 of gain element 610 is illustrated. Gain element 610.1 includes resistors RD1, RD2, wherein RD1 can be a static resistance and RD2 can be a variable resistance. The voltage Vm is dropped across the resistive divider formed by the series combination of RD1 and RD2, and an output voltage VRIN of gain element 610.1 is generated based on the ratio defined by the resistive divider. VRIN is provided to the input of a negative diode rectifier 630.1, which is a specific exemplary embodiment of a negative rectifier 630.

Note in alternative exemplary embodiments (not shown), RD1 may readily be made variable while RD2 may be made static to achieve the variable voltage division functionality described hereinabove. Alternative exemplary embodiments may employ, e.g., capacitive dividers rather than or in conjunction with resistive dividers to implement the gain element 610 as described hereinabove. Furthermore, active gain elements (not shown), e.g., amplifiers, may be further or alternatively provided to implement the gain element 610. Such alternative exemplary embodiments are contemplated to be within the scope of the present disclosure.

Note in the gain element 610.1, an optional control transistor 702 with gate voltage SD may be further provided to disable the negative rectifier 630.1 when desired, by effectively setting VRIN to zero.

Figure 8:
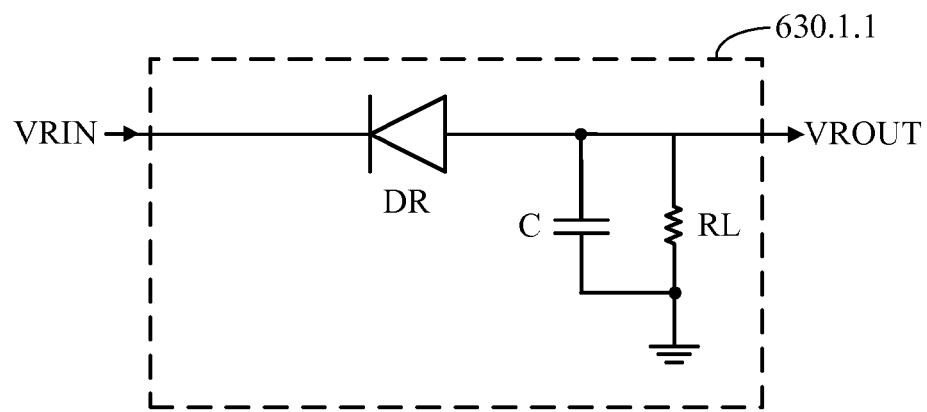
FIG. 8 illustrates an exemplary embodiment of a negative diode rectifier.

FIG. 8 illustrates an exemplary embodiment 630.1.1 of negative diode rectifier 630.1. Note FIG. 8 is shown for illustrative purposes only, and is not meant to limit the scope of the present disclosure to any particular exemplary embodiment shown.

Figure 9:
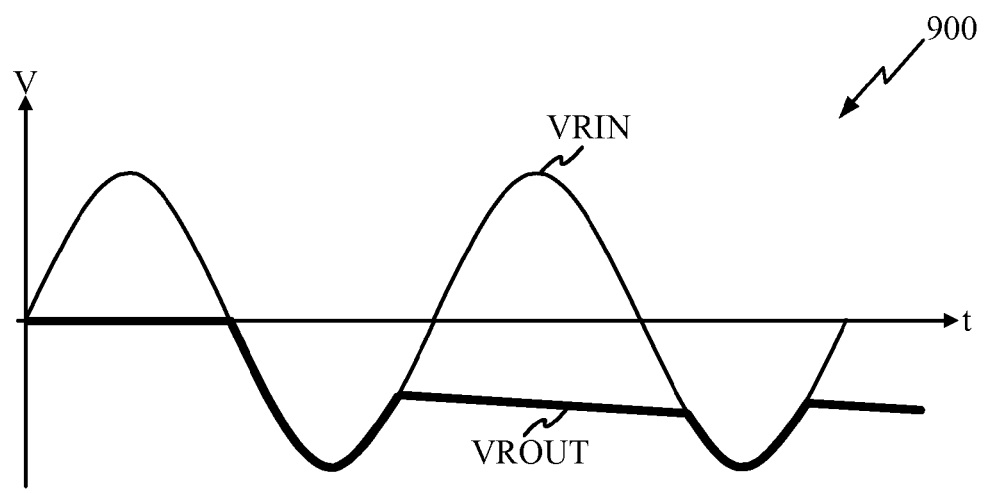
FIG. 9 illustrates an exemplary waveform showing the relationship between an input waveform and output waveform of the negative diode rectifier.

In FIG. 8, negative diode rectifier 630.1.1 incorporates a diode DR, a capacitor C, and resistor RL. The diode DR is configured to be forward-biased when VRIN is more negative than VROUT. FIG. 9 illustrates an exemplary waveform in plot 900 showing the relationship between an input waveform VRIN and the output waveform VROUT of the negative diode rectifier 630.1.1. Note FIG. 9 is shown for illustrative purposes only, and is not meant to limit the scope of the present disclosure to any particular exemplary waveforms shown therein.

Note the exemplary embodiment 630.1.1 is not meant to limit the scope of the present disclosure to half-wave rectifiers. It will be appreciated that techniques of the present disclosure may readily be adapted to accommodate full-wave rectifiers as well. Such alternative exemplary embodiments are contemplated to be within the scope of the present disclosure.

Figure 10:
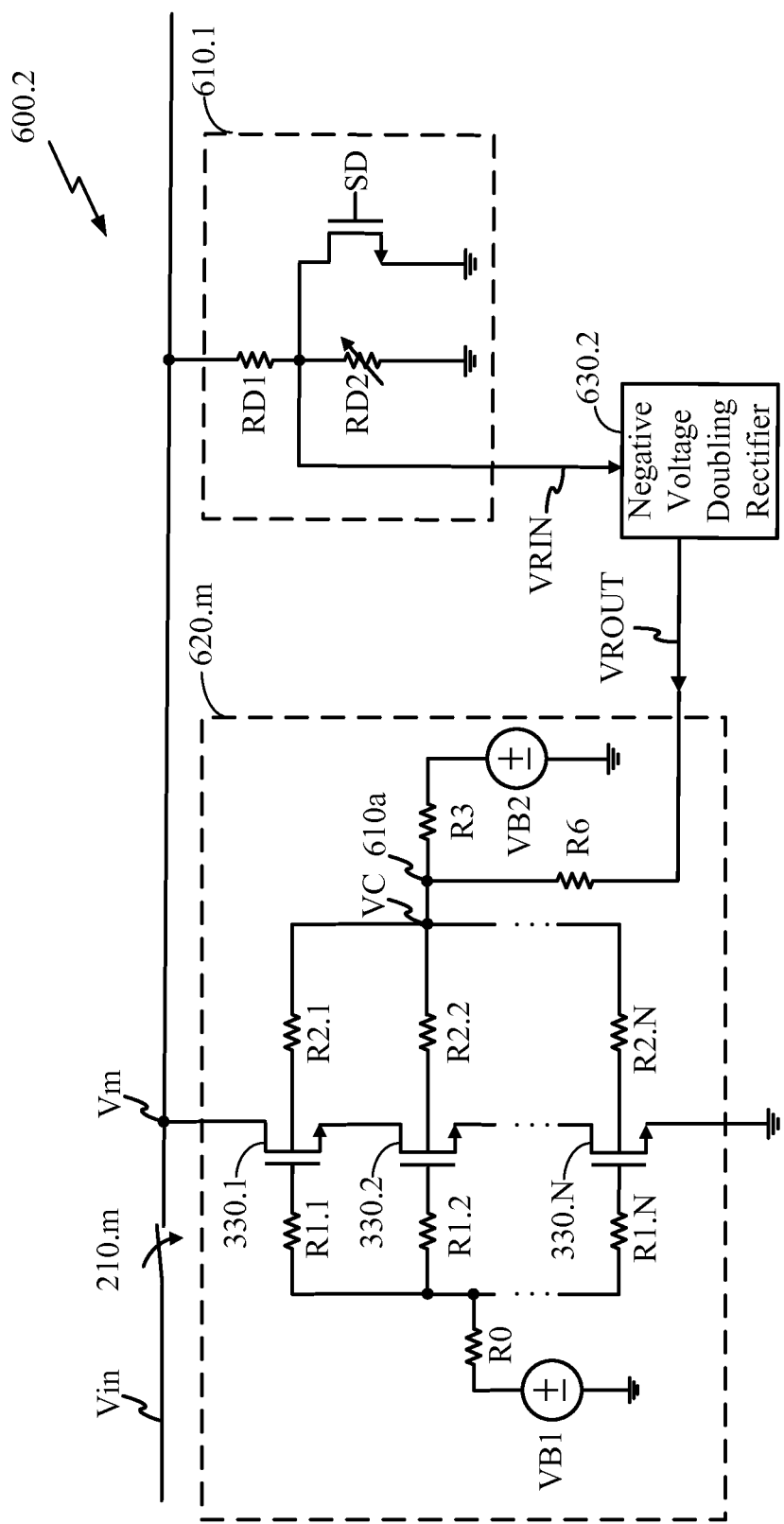
FIG. 10 illustrates an alternative exemplary embodiment of the present disclosure incorporating a specific gain element and a negative voltage doubling rectifier.

FIG. 10 illustrates an alternative exemplary embodiment 600.2 of the present disclosure incorporating a specific gain element 610.1 and a negative voltage doubling rectifier 630.2. Note FIG. 10 is shown for illustrative purposes only, and is not meant to limit the scope of the present disclosure to any particular exemplary embodiment shown.

In FIG. 10, a negative voltage doubling rectifier 630.2 is provided as an alternative specific exemplary embodiment of the negative rectifier 630. It will be appreciated that an advantage of negative voltage doubling rectifier 630.2 over, e.g., negative diode rectifier 630.1, is that negative voltage doubling rectifier 630.2 can generate a more negative output voltage than negative diode rectifier 630.1. In this manner, even more negative substrate bias voltages may be provided to the transistors to more completely turn off the corresponding shunt switch, according to the principles of the present disclosure.

Figure 11:
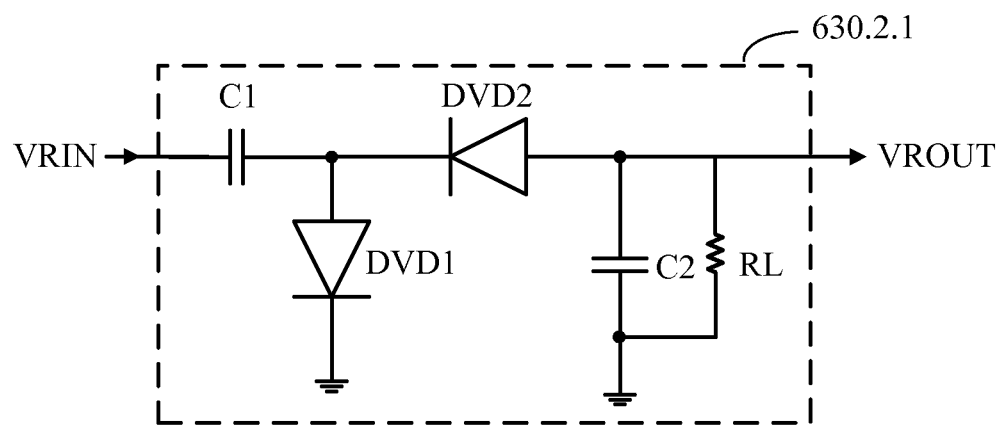
FIG. 11 illustrates an exemplary embodiment of the negative voltage doubling rectifier.

FIG. 11 illustrates an exemplary embodiment 630.2.1 of the negative voltage doubling rectifier 630.2. Note the operating principles of the negative voltage doubling rectifier circuitry 630.2.1 in FIG. 11 will be clear to one of ordinary skill in the art, and will not be further discussed hereinbelow.

While certain exemplary embodiments of negative rectifier 630 have been described hereinabove with reference to FIGS. 8 and 11, it will be appreciated that alternative techniques for implementing negative rectifiers will be clear to one of ordinary skill in the art in light of the techniques disclosed hereinabove. Such alternative exemplary embodiments are contemplated to be within the scope of the present disclosure.

Figure 12:
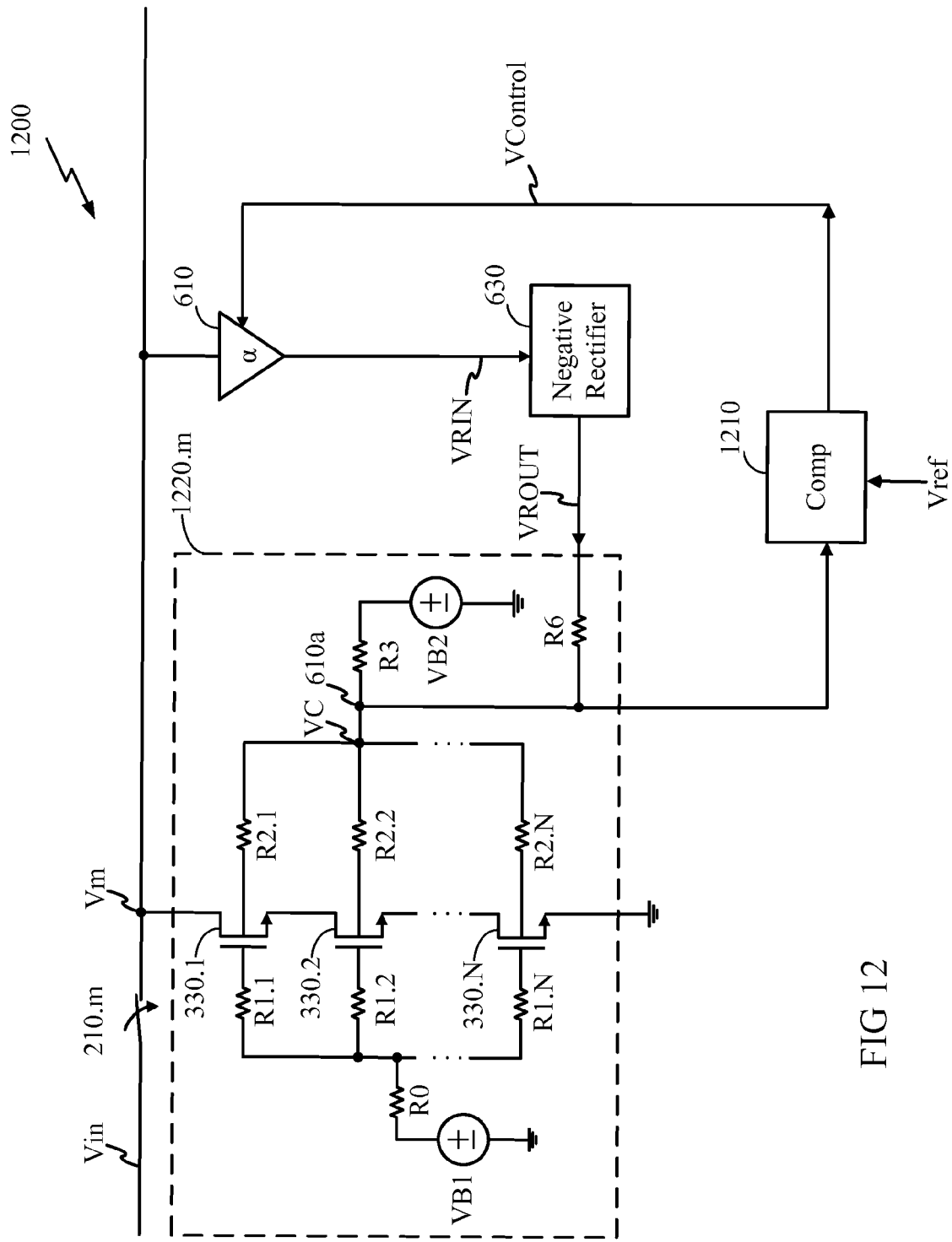
FIG. 12 illustrates an alternative exemplary embodiment of the present disclosure, wherein a closed-loop technique is employed.

FIG. 12 illustrates an alternative exemplary embodiment 1200 of the present disclosure, wherein a closed-loop technique is employed to control the substrate bias voltages. Note FIG. 12 is shown for illustrative purposes only, and is not meant to limit the scope of the present disclosure to any particular exemplary embodiment shown.

In FIG. 12, a comparison circuit 1210 compares an input voltage VC with a reference voltage Vref to generate an amplified version of the difference as output control voltage VControl. VControl is provided to gain element 610 to adjust the scaling factor (a) applied to Vm. In this manner, the output of the negative rectifier 630 is continually adjusted to maintain a constant substrate bias voltage VC, e.g., approximately equal to Vref, thus improving the overall linearity of the shunt switch. It will be appreciated that an advantage of a closed-loop implementation over, e.g., an open-loop implementation is that the body voltage may accordingly be held constant over variations in, e.g., process, temperature, and voltage swings.

In an exemplary embodiment, it will be appreciated that Vref may be set based on linearity and reliability constraints. In alternative exemplary embodiments, other parameters may be used to perform the sensing and adjustment of closed-loop parameters. For example, one or more additional or alternative sensing resistors (not shown in FIG. 13) may be provided, e.g., in series between node 610a and VC in FIG. 13, and the closed-loop feedback may be configured such that the voltage across such sensing resistor(s) is (are) kept constant. Such alternative exemplary embodiments are contemplated to be within the scope of the present disclosure.

Figure 13:
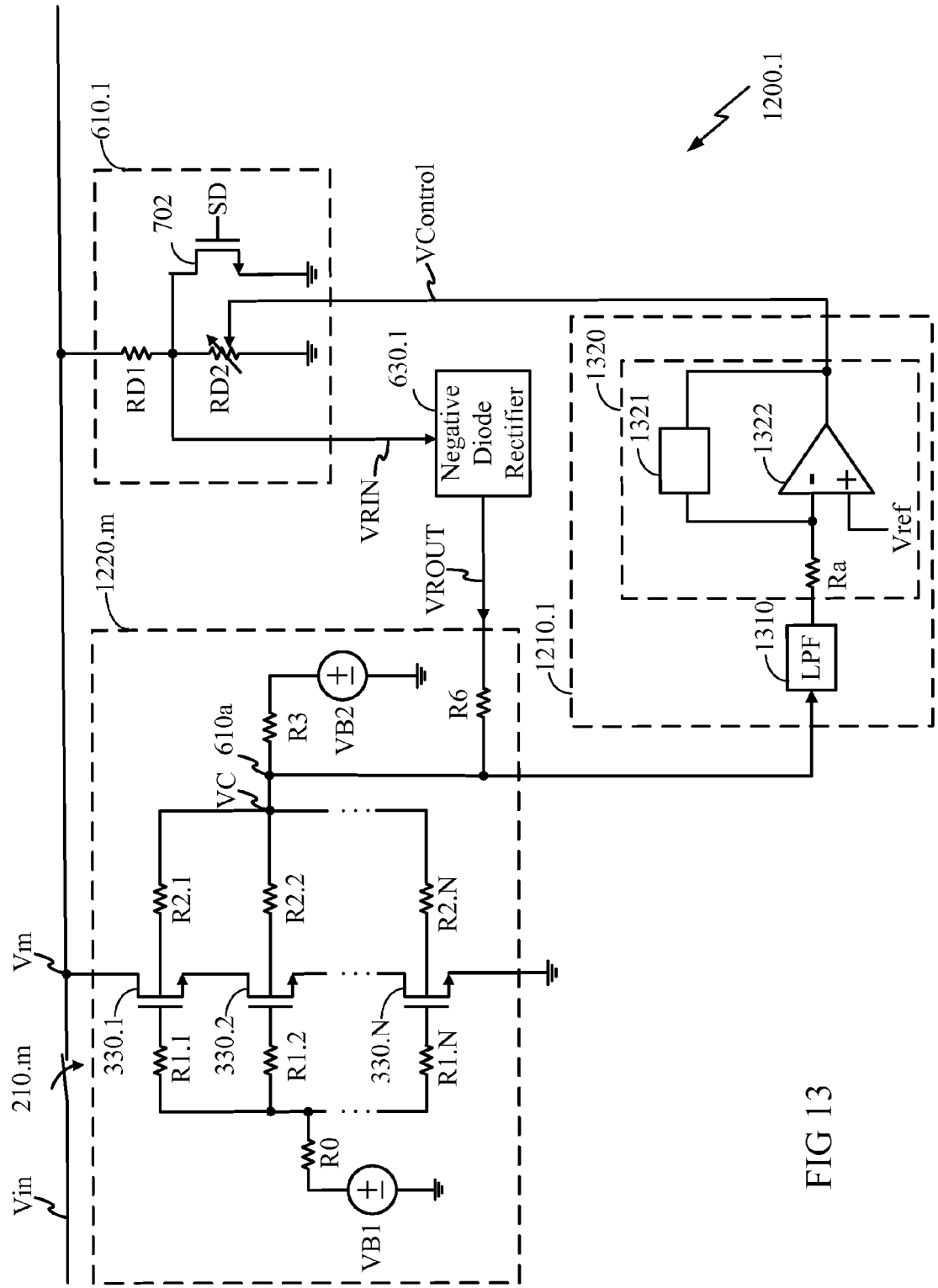
FIG. 13 illustrates an exemplary embodiment of the closed-loop technique incorporating an exemplary comparison circuit.

FIG. 13 illustrates an exemplary embodiment 1200.1 of the closed-loop technique 1200 incorporating an exemplary comparison circuit 1210.1. Note FIG. 13 is shown for illustrative purposes only, and is not meant to limit the scope of the present disclosure to any particular comparison circuit shown.

In FIG. 13, comparison circuit 1210.1 includes a low pass filter (LPF) 1310 coupled to VC. The output of LPF 1310 is coupled to an input of operational amplifier (op amp) 1322 via resistor Ra. Reference voltage Vref is coupled to another input of op amp 1322, which is also provided with a feedback block 1321. The output voltage of op amp 1322 is provided as the comparator output VControl, earlier described hereinabove with reference to FIG. 12. It will be appreciated that the low-pass filtered version of VC will be driven by the feedback loop 1321 to be approximately equal to the reference voltage Vref.

Figure 14:
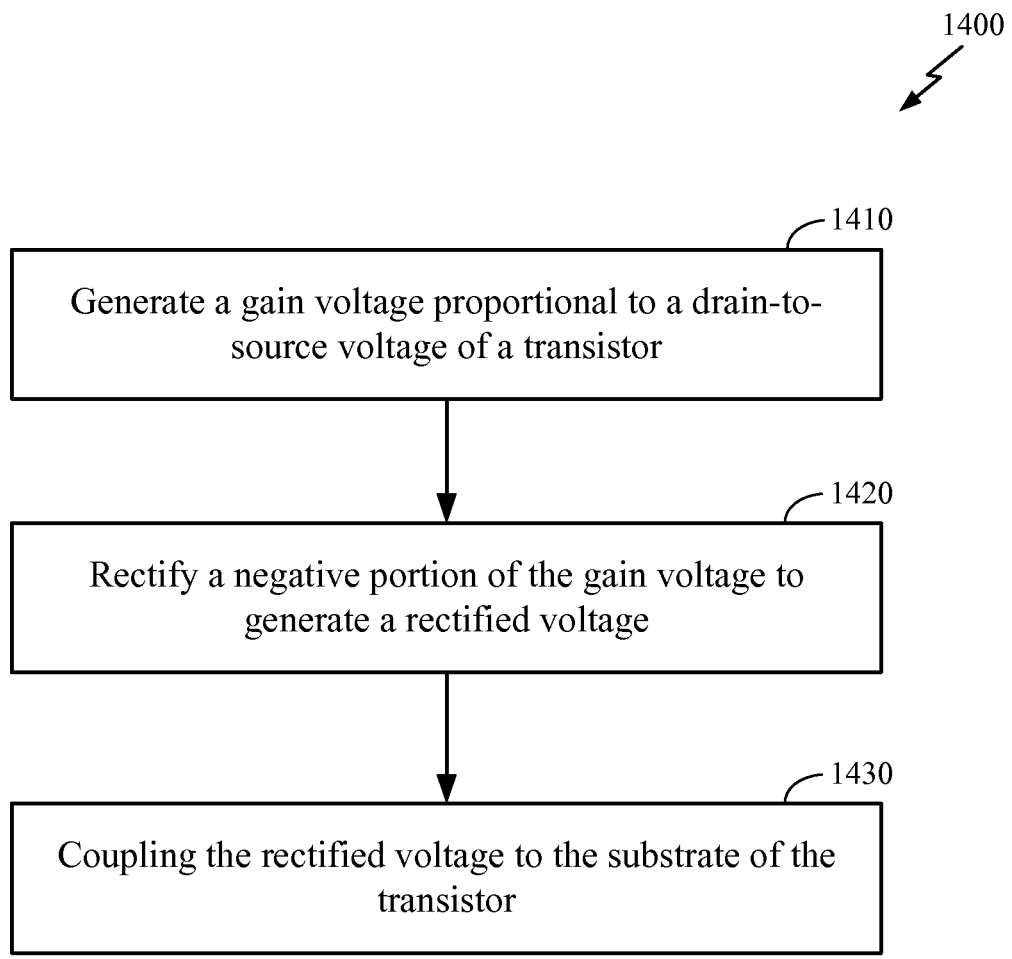
FIG. 14 illustrates an exemplary embodiment of a method according to the present disclosure.

FIG. 14 illustrates an exemplary embodiment of a method 1400 according to the present disclosure. Note FIG. 14 is shown for illustrative purposes only, and is not meant to limit the scope of the present disclosure to any particular exemplary embodiment of a method shown.

In FIG. 14, at block 1410, a gain voltage proportional to a drain-to-source voltage of a transistor is generated.

At block 1420, a negative portion of the gain voltage is rectified to generate a rectified voltage.

At block 1430, the rectified voltage is coupled to the substrate of the transistor.

Figure 15:
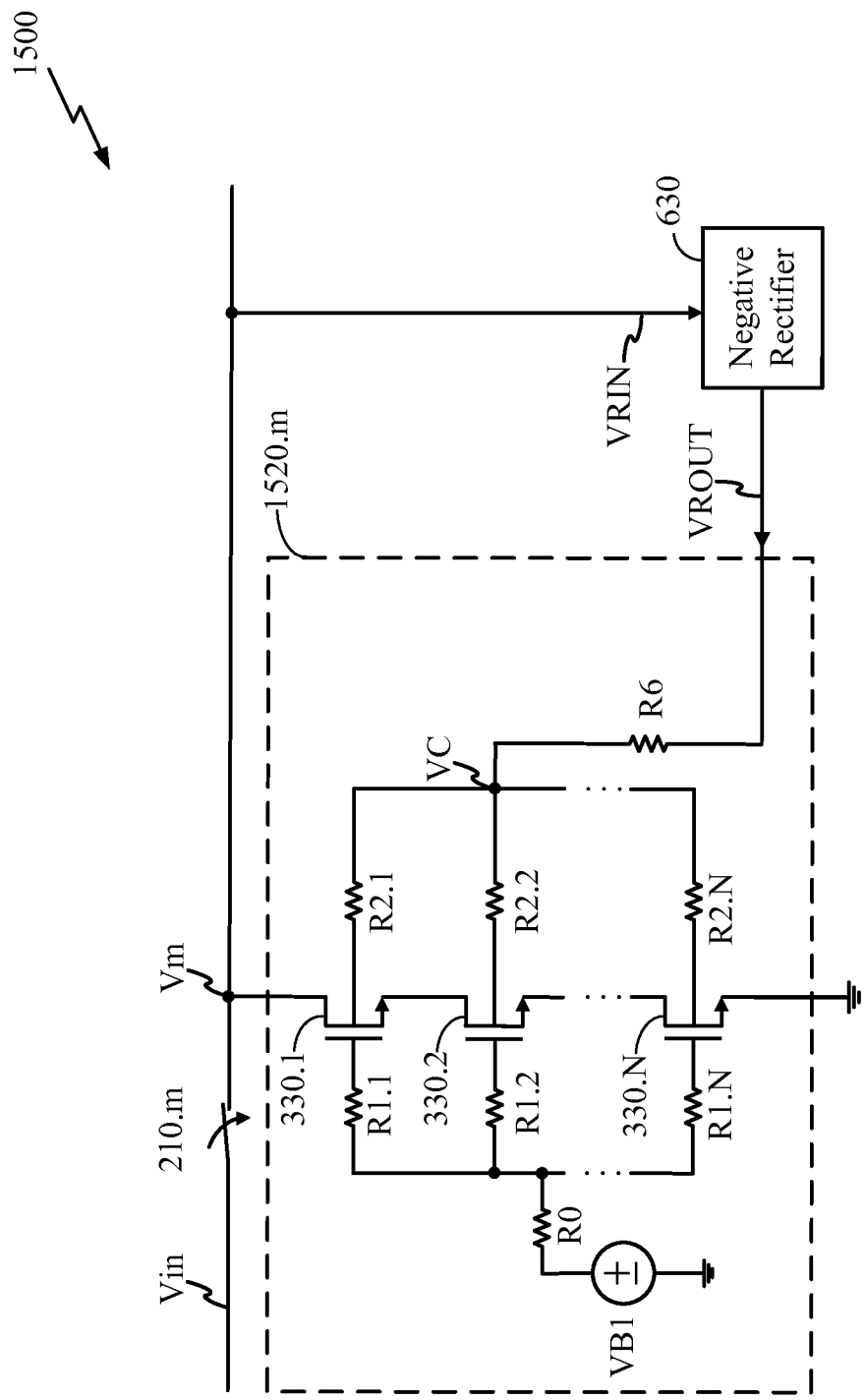
FIG. 15 illustrates an alternative exemplary embodiment of the present disclosure, wherein the output voltage of the negative rectifier is directly coupled to the substrate bias voltage.

FIG. 15 illustrates an alternative exemplary embodiment of the present disclosure, wherein the output voltage VROUT of negative rectifier 630 is directly coupled to the substrate bias voltage VC. Furthermore, Vm is directly coupled to negative rectifier 630 as VRIN. Accordingly, it will be appreciated that the negative rectifier 630 directly rectifies the RF input voltage Vm to generate the rectified output voltage VROUT. Furthermore, VROUT is directly coupled to the substrate bias voltage VC via R6, without, e.g., being further superimposed on a separately generated bias voltage.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present. Furthermore, when an element is referred to as being "electrically coupled" to another element, it denotes that a path of low resistance is present between such elements, while when an element is referred to as being simply "coupled" to another element, there may or may not be a path of low resistance between such elements.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the exemplary aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary aspects of the invention.

The various illustrative logical blocks, modules, and circuits described in connection with the exemplary aspects disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary aspects disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-Ray disc where disks usually reproduce data magnetically, while discs reproduce data optically with lasers. Combinations of the above should also be included within the scope of computer-readable media.

The previous description of the disclosed exemplary aspects is provided to enable any person skilled in the art to make or use the invention. Various modifications to these exemplary aspects will be readily apparent to those skilled in the art, and the generic principles defined herein may be applied to other exemplary aspects without departing from the spirit or scope of the invention. Thus, the present disclosure is not intended to be limited to the exemplary aspects shown herein but is to be accorded the widest scope consistent with the principles and novel features disclosed herein.

The invention claimed is:

1. An apparatus comprising:
a transistor having a substrate; and
a negative rectifier configured to rectify a negative portion of a voltage related to a drain-to-source voltage of the transistor,
the substrate coupled via a first resistor to a constant bias voltage and coupled via a second resistor to an output of the negative rectifier.

2. The apparatus of claim 1, further comprising a gain element configured to generate the voltage related to the drain-to-source voltage of the transistor as a gain voltage proportional to the drain-to-source voltage of the transistor.

3. The apparatus of claim 2, the gain element comprising a series resistive divider, wherein at least one resistor of the series resistive divider has an adjustable resistance.

4. The apparatus of claim 2, further comprising:
closed-loop circuitry for adjusting a gain of the gain element such that a substrate bias voltage of the transistor is approximately equal to a reference voltage.

5. The apparatus of claim 4, the closed-loop circuitry comprising:
a low-pass filter coupled to the substrate bias voltage; and
operational amplifier circuitry having a first input coupled to the low-pass filter and having a second input coupled to the reference voltage, wherein the operational amplifier circuitry is coupled to a resistor in the gain element that has an adjustable resistance.

6. The apparatus of claim 2, the gain element comprising a capacitive divider.

7. The apparatus of claim 1, the negative rectifier comprising a negative diode rectifier.

8. The apparatus of claim 7, the negative diode rectifier comprising a negative voltage doubler.

9. The apparatus of claim 1, further comprising a plurality of transistors coupled in series with the transistor, wherein each of the plurality of transistors is coupled to the negative rectifier.

10. The apparatus of claim 9, wherein gates of the plurality of transistors are coupled to a negative bias voltage.

11. An apparatus comprising:
 means for rectifying a negative portion of a voltage related to a drain-to-source voltage of a transistor to generate a rectified voltage;
 means for coupling the rectified voltage to a substrate of the transistor;
 means for generating the voltage related to the drain-to-source voltage of the transistor as a voltage proportional to the drain-to-source voltage of the transistor; and
 means for adjusting the voltage proportional to the drain-to-source voltage to maintain a constant rectified voltage.

12. The apparatus of claim 11, the means for rectifying the negative portion comprising means for coupling the voltage proportional to the drain-to-source voltage to a negative voltage doubler.

13. The apparatus of claim 12, the means for rectifying the negative portion further comprising a negative diode rectifier.

14. A method comprising:
 rectifying a negative portion of a voltage proportional to a drain-to-source voltage of a transistor to generate a rectified voltage; and
 coupling the rectified voltage via a first resistor to a substrate of the transistor, wherein the substrate of the transistor is coupled via a second resistor to a constant bias voltage.

15. The method of claim 14, wherein rectifying the negative portion comprises coupling the voltage proportional to the drain-to-source voltage to a negative voltage doubler.

16. The apparatus of claim 7, the negative diode rectifier comprising:
 an input terminal;
 an output terminal;
 a capacitor coupled to ground and coupled to the output terminal;
 a resistor coupled to ground and coupled to the output terminal; and
 a diode coupled to the input terminal and coupled to the output terminal.

17. The apparatus of claim 1, wherein the transistor is included in a shunt switch configured to ground voltages associated with an inactive signal path of a transceiver.

18. The apparatus of claim 17, wherein the inactive signal path is tuned to a first frequency band of a plurality of frequency bands.

19. The apparatus of claim 11, wherein the means for adjusting the voltage proportional to the drain-to-source voltage of the transistor maintains a substantially constant rectified voltage.

* * * * *